United States Patent
Uzoh

(10) Patent No.: US 6,274,935 B2
(45) Date of Patent: Aug. 14, 2001

(54) COPPER WIRE-BONDING PAD

(75) Inventor: Cyprian E. Uzoh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/734,939

(22) Filed: Dec. 12, 2000

Related U.S. Application Data

(62) Division of application No. 09/227,013, filed on Jan. 7, 1999, now Pat. No. 6,180,505.

(51) Int. Cl.[7] ............... H01L 23/48; H01L 23/52; H01L 29/40
(52) U.S. Cl. ............... 257/762; 257/748; 257/750; 257/766; 257/781; 257/784; 438/612; 438/614
(58) Field of Search .................... 257/751, 748, 257/762, 766, 781, 737, 750, 784; 438/614, 612

(56) References Cited

U.S. PATENT DOCUMENTS

| | | | |
|---|---|---|---|
| 4,661,416 | 4/1987 | Mizuhara | 428/606 |
| 4,814,049 | 3/1989 | Helton et al. | 204/442 |
| 5,071,518 | 12/1991 | Pan | 205/122 |
| 5,098,860 | 3/1992 | Chakravorty et al. | 438/628 |
| 5,106,461 | 4/1992 | Volfson et al. | 205/125 |
| 5,213,638 | 5/1993 | Mahulikar et al. | 148/627 |
| 5,308,796 | 5/1994 | Feldman et al. | 438/655 |
| 5,320,689 | 6/1994 | Mahulikar et al. | 148/436 |
| 5,385,661 | 1/1995 | Andricacos et al. | 205/239 |

FOREIGN PATENT DOCUMENTS

| | | | |
|---|---|---|---|
| 64-64338 | 3/1989 | (JP) . | |
| 11-103164 | * 4/1994 | (JP) | H05K/3/34 |

* cited by examiner

Primary Examiner—Charles Bowers
Assistant Examiner—Hsien-Ming Lee
(74) Attorney, Agent, or Firm—Ratner & Prestia; Tiffany L. Townsend, Esq.

(57) ABSTRACT

A copper-containing, wire-bonding pad structure for bonding to gold wires. The structure includes a nickel-containing film to improve metallurgical characteristics. The structure also has a laminated impurity film within the copper pad, which complexes with the nickel-containing pad to prevent a destructive interaction between nickel and copper at elevated temperatures, or during the lifetime of the device or the wirebond.

8 Claims, 7 Drawing Sheets

COPPER WIRE-BONDING PAD

This application is a divisional of U.S. patent application Ser. No. 09/227,013, filed on Jan. 7, 1999, now U.S. Pat. No. 6,180,505.

FIELD OF THE INVENTION

The present invention is related to a process and structure for providing a copper interconnect film used in the semiconductor packaging industry. More particularly, the present invention is directed to providing a copper film structure that contains impurities and provides superior wire bonding characteristics.

BACKGROUND OF THE INVENTION

Low-cost, wire-bonding processes for copper interconnect and copper packaging technologies are a critical issue that needs to be resolved for copper interconnection technologies to rapidly penetrate the consumer goods sector of the electronics market. Using the present technology, gold wire may not be directly attached to a final copper metal level because of the poor reliability of the copper-to-gold wire-bonding metallurgy. In addition, wire-bond pads containing copper surfaces that are exposed to the environment are unacceptable because exposed copper surfaces are prone to corrosion.

One process, directed to circumventing the issues associated with the copper-to-gold bonding, is the use of aluminum as a final metal film to contact the gold wire bond. The use of an aluminum film requires, however, an additional photomask step and an additional patterning step, which is typically reactive ion etching. These two additional steps, together with the associated pre-cleaning and photoresist removal steps, require additional processing materials, additional time, and additional expenses.

The prior art process which uses an aluminum film to provide contact between copper and gold bonding wires is best described as follows. After the final metal cooper structure is formed on the surface to be bonded, a dual dielectric film is deposited over the copper surface. This deposition is followed by a polyimide layer formed over the dielectric film. The polyimide serves as a further insulator. The polyimide and underlying passivating dielectric are patterned and etched using reactive ion etching. In this manner, a section of the final copper metal film is exposed. This exposed section will be used to provide contact to the wire-bonding gold. Exposed surfaces of copper film are undesirable for providing direct contact to gold wire bonds.

Therefore, at this point in the conventional process, an aluminum film is added. A dual metal layer is deposited as follows. First, a barrier film, which isolates the copper and aluminum metals from each other, is deposited. The deposition of the barrier material is not a selective deposition process. As such, the barrier material contacts the exposed copper surface and also covers the patterned dielectric and polyimide films. Next, an aluminum film is formed over the entire surface of the barrier layer. This dual layer (barrier layer and aluminum) material must then be patterned and subsequently etched. A photolithographically sensitive film is used to form a pattern of this dual layer metal film. After the films are removed by etching, and the photolithographically sensitive film is removed, the gold wire bond may be connected to the aluminum film which is contacted to the copper film through the barrier material.

Another, less expensive, alternative to aluminum wire bonding over copper may be the use of an electroless deposition process to form compounds such as CoP and NiP as contact layers for gold wire bonding. In this process, after a pattern has been created in the insulating layers to expose the portion of the final copper film which is to be bound (as above), a layer of CoP is selectively deposited over the exposed film region. This CoP film acts a copper barrier. The CoP layer is then passivated with electroless NiP to prevent the oxidation of the CoP. The NiP is plated selectively over the CoP barrier film. The NiP is then selectively covered with gold using immersion or electroless plating techniques. After the immersion or electroless gold film has been selectively deposited, the structure is ready for wire bonding to the gold wire-bonding line.

A simpler structure could be formed by eliminating the CoP barrier layer and depositing NiP directly over the exposed copper surface. A major shortcoming of this approach is that, above 300° C., the NiP film interacts with the exposed copper to produce a bond pad metallurgy with a resistance which is too high for wire-bonding applications. Therefore, what is needed in the art is a procedure which uses the selectively deposited NiP film but does not require the CoP barrier layer, yet produces a bond pad metallurgy with acceptably low resistance values.

SUMMARY OF THE INVENTION

The present invention overcomes the shortcomings of current processing approaches. The present invention provides for the introduction of the NiP film directly onto the copper metal pad, and also prohibits the interaction between the NiP film and the copper which has resulted in unacceptably high resistance values as in the prior art. The present invention discloses a process for laminating impurities such as oxygen, copper, nitrogen, and sulfur close to the exposed upper surface of the copper metal pad. After this laminated impurity film is created and additional copper is added, a transition film such as NiP is deposited directly over the pad which contains the buried, laminated impurities. The NiP layer is then capped with immersion or electroless gold.

To stabilize the structure, the entire structure is heated in an inert ambient. During this heat-treatment stabilization, the buried, laminated impurities (such as oxygen, carbon, nitrogen, and sulfur) segregate to the Cu—NiP interface. Here, the laminated impurities interact with NiP to form complexes such as NIP(O) or other complexes including carbon, nitrogen, and sulfur at the interface between the NiP and the exposed copper surface. This NiP(O) or other complex impedes the undesired high-temperature reaction of NiP and copper thereby enhancing the reliability of the Cu—NiP interface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

FIG. 1 shows a plated metal copper film formed on a damascene structure;

FIG. 2 shows the structure of FIG. 1 after the exposed copper surface has been modified;

FIG. 3 shows an impurity film laminated within the structure of FIG. 2;

FIG. 4 shows a photoresist pattern formed on the structure of FIG. 3;

FIG. 5 shows the metal film structure of FIG. 4 after it has been patterned;

FIG. 6 shows a completed bond pad of an exemplary embodiment of the present invention;

FIG. 7 is a cross-section showing a structure of the present invention using the plate-through process;

FIG. 8 is a cross-section showing a completed bond pad of the second exemplary embodiment of the present invention;

FIG. 9 is a cross-section showing an impurity-laminated film within an electroplated film structure;

FIG. 10 is a cross-section showing the damascene structure of FIG. 9 after it has been polished;

FIG. 11 is a cross-section showing the structure of FIG. 10 after insulating films have been added and patterned;

FIG. 12 shows the structure of FIG. 11 after a nickel phosphorus film has been added; and FIG. 13 is a cross-section showing a completed structure of the third exemplary embodiment of the present invention.

DETAILED DESCRIPTION

An important feature of the present invention is the formation of an impurity film which is laminated onto the surface of a copper film which has been roughened. The function of this laminated impurity is to complex with a subsequently deposited NiP film. Such a complex prevents the undesirable interaction between the NiP film and the copper film which would otherwise cause high resistance and produce a bond pad unsuitable for wire-bonding applications. Because of this feature, the CoP film commonly required in the prior art, to serve as a barrier between the exposed copper surface and the NiP film, is not required.

When damascene processing techniques are used, the impurity film is laminated onto the surface of the copper film in a region close to the top of the trench formed within an insulator. In this manner, after additional copper is added and the completed damascene pad is formed, the laminated impurity layer is near the top surface of the pad which will contact the subsequently added NiP.

Figure 1:
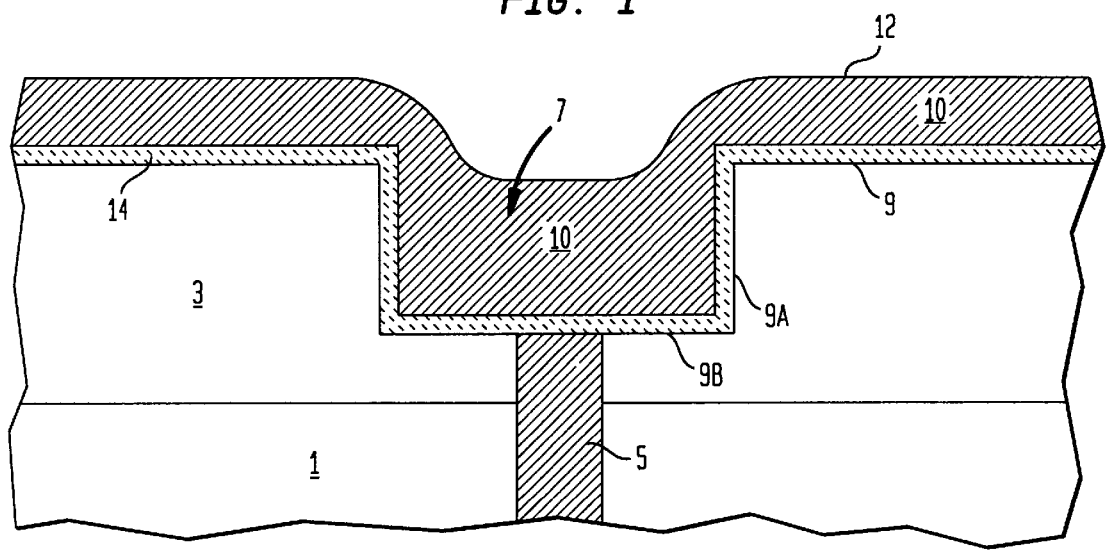
FIGS. 1 through 6 are cross-sections showing the process sequence used to form an exemplary embodiment of the present invention. More specifically.

FIG. 1 is a cross-section showing an insulating film 3 formed on a semiconductor substrate 1. A trench 7 has been formed within the insulating film 3. Via 5 is used to connect a metal structure, such as a wire-bond pad formed within the trench, to subjacent circuitry. The damascene structure includes an exposed upper surface 9 as well as exposed surfaces 9A (side walls) and 9B (the bottom of trench 7). A barrier layer 14 is formed covering all of the exposed surfaces 9, 9A, and 9B. The barrier layer 14 may be any suitable barrier material common in the art and may be formed by any suitable process.

On top of the barrier layer 14, a bulk copper film 10 is formed. Copper film 10 has an upper surface 12. In the preferred embodiment, copper film 10 may be formed by electrodeposition using a plating solution. The plating solution is also subsequently used to form an impurity film which is laminated onto the surface of the electroplated bulk copper film 10. The plating bath formulation may consist of copper sulfate pentahydrate with a concentration of 20 to 150 grams per liter, but preferably within the range of 30 to 150 grams per liter. The copper sulfate pentahydrate is dissolved in a solution containing deionized water and containing approximately 3 to 25% sulfuric acid by volume. In the preferred embodiment, the sulfuric acid content may range from 5 to 20% by volume.

The plating formulation also includes additives. For example, chlorine may be added to the solution within a range of 20 to 180 parts per million and, in the preferred embodiment, may range between 30 to 150 ppm. The plating bath may also contain other commercially available additives such as MD and $ML_o$. With respect to additive MD, the concentration may range from 2 milliliters per liter (ml/l) to 25 ml/l and, in the preferred embodiment, is within the range of 3 ml/l to 20 ml/l. With respect to the concentration of additive $ML_o$ within the bath, the concentration range of the preferred embodiment is between 0.3 to 3.5 ml/l, but may range from 0.2 ml/l to 5 ml/l.

After a brief dwell period within the plating solution, the plating process is initiated. During the plating process, the electroplating current density ranges from 7 $mA/cm^2$ to 35 $mA/cm^2$ in the preferred embodiment, but may range from 5 $mA/cm^2$ to 70 $mA/cm^2$. The anode material consists of a CuP alloy, as typically used in copper electrodeposition. The electroplating time is determined by the plating current density and the desired thickness of the electroplated film being formed. The desired thickness is chosen so that, after the copper film is formed, at least 85% of the cross-sectional area of original trench 7 is filled with the copper film. As deposited, copper film 10 is formed over the barrier layer 14 formed on surfaces 9, 9A, and 9B. Electroplated copper film 10 includes impurities electrodeposited along with the copper from the additives included in the plating solution.

Figure 2:
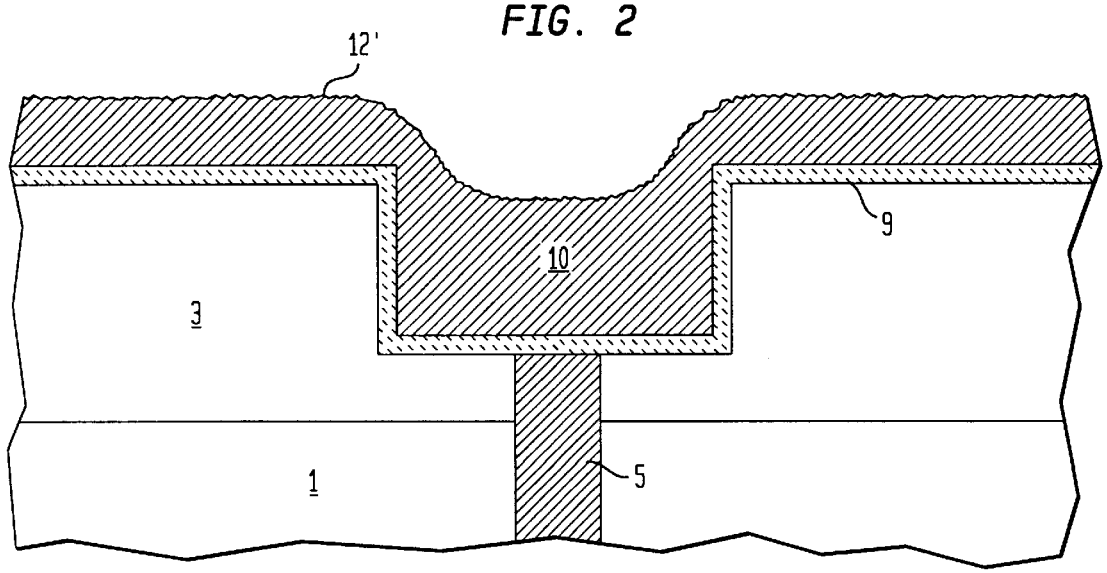

Now turning to FIG. 2, upper surface 12 shown in FIG. 1 is treated to form roughened surface 12'. Roughened surface 12' is formed by moving the substrate 1 from the plating solution into an oxygen-containing environment. In alternate embodiments, in which the copper film 10 is formed by processes other than electroplating, the upper surface 12 is contacted with a plating solution as described above. The plating solution is then mechanically removed from upper surface 12 in the oxygen-containing environment. In the preferred embodiment, the oxygen-containing environment may simply be air, and the preferred process for mechanical removal may be spin-drying the substrate 1. The spin speed used to remove the plating solution from the substrate 1 may range from 10 to 2,500 RPM, but preferably will lie within the range of 200 to 800 RPM. The spin time necessary to completely remove the plating solution from the upper surface 12 depends on the spin speed used, and will typically range from 10 to 45 seconds. This "spin-off" step increases the surface area of the exposed surface by forming a micro-surface within the originally formed upper surface 12 of copper film 10. The step exposes high crystallographic index planes to form exposed roughened surface 12' which, as modified, provides for increased adsorption of impurities laminated onto the roughened surface 12' during subsequent processing steps.

The following examples are included to more clearly demonstrate the overall nature of the invention. These examples are exemplary, not restrictive, of the invention.

EXAMPLE 1

Figure 3:
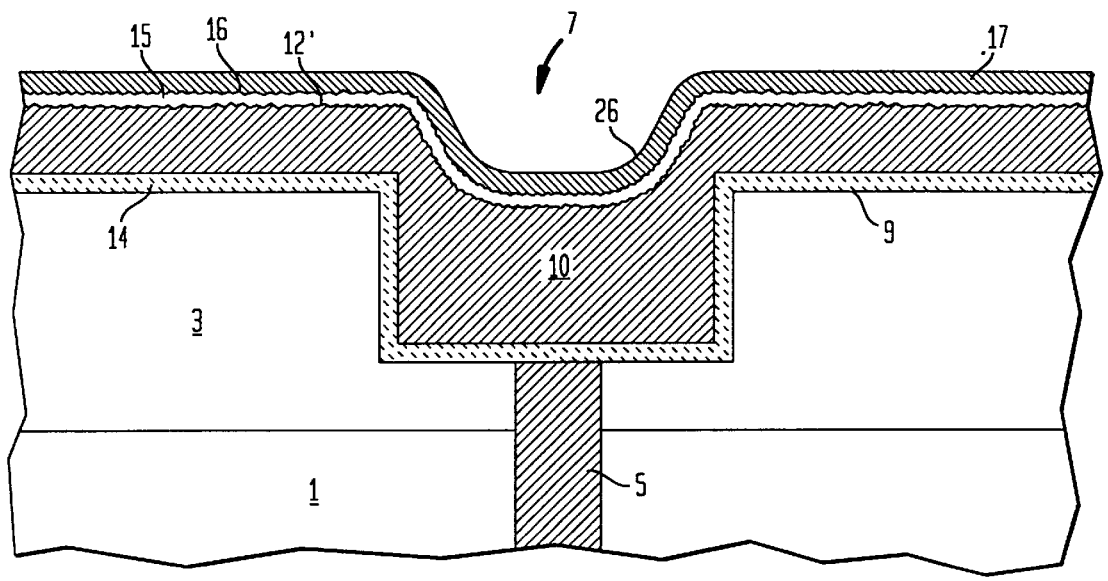

FIG. 3 shows an laminated impurity film 15 formed on top of roughened surface 12'. This laminated impurity film 14 is formed by placing the substrate 1 into the same plating solution, used to electrodeposit bulk copper film 10, and allowing the substrate 1 to dwell-in the plating solution before the application of the electroplating current. Typical dwell times in the solution may range from 0 to 30 seconds and, in the preferred first embodiment, may lie within the range of 2 to 10 seconds. During this time, a minimal current of 3 to 5 mA/cm$^2$, which is much less than the electroplating current, may be applied, or the solution may be maintained in an electrically neutral state. During this dwell period before the electroplating current is applied, additives from the bath adsorb onto the large micro-surface area and the high crystallographic index planes created by the prior processing step.

In this manner, an impurity film 15 is laminated onto bulk copper film 10 and, more directly, onto roughened surface 12'. The additives contained in the plating solution are preferentially absorbed from the solution and onto the copper microstructure during this lamination process. Thus, a thin film with a high impurity content is laminated onto the microstructure to provide a discrete region of impurity concentration within the composite film structure. The impurity concentration in this discrete region is much higher than a corresponding impurity concentration within the bulk copper film 10 produced by electroplating from the same electroplating solution. In the preferred first embodiment, oxygen may be laminated onto roughened surface 12', but carbon, nitrogen, and sulfur may be added alternatively or additionally. The laminated impurity film 15 has a top surface 16 and may be as thin as an atomic mono-layer in thickness. Impurity film 15 is shown enlarged, in FIG. 3, for clarity.

Following this process step, a second copper film 17 is formed by electrodeposition over the laminated impurity film 15 on modified copper roughened surface 12'. The thickness of the second copper film 17 is determined by subsequent processing requirements but will typically be much thinner than the first electrodeposited copper film 10. If chemical mechanical polishing steps will be subsequently used to form a structure within the damascene trench, a minimal thickness of electroplated metal must be added in order to fill the original trench 7. The process used for electrodeposition may be as described above, but any electrodeposition process suitable in the art may be used. In the preferred first embodiment, the thin electrodeposited second copper film 17 with an upper surface 26 is added to the structure. In this manner, the buried laminated impurity film 15 is close to upper surface 26 and can more efficiently interact with a film such as NiP (not shown) which will subsequently be formed over upper surface 26.

After the metal plating step used to form electroplated second copper film 17, the deposited metal may be stabilized by an initial annealing process performed in an inert ambient, such as nitrogen or argon, or in a vacuum. The preferred annealing temperature may range from 200° C. to 450° C., but can range from 100° C. to 550° C. in alternate embodiments. The preferred annealing time will range from 15 minutes to 90 minutes, but in alternate embodiments may range from 10 minutes to 120 minutes. After the initial annealing process is completed, a pattern may be formed in the metal film structure to form a bond pad which will be used for wire bonding.

Figure 4:
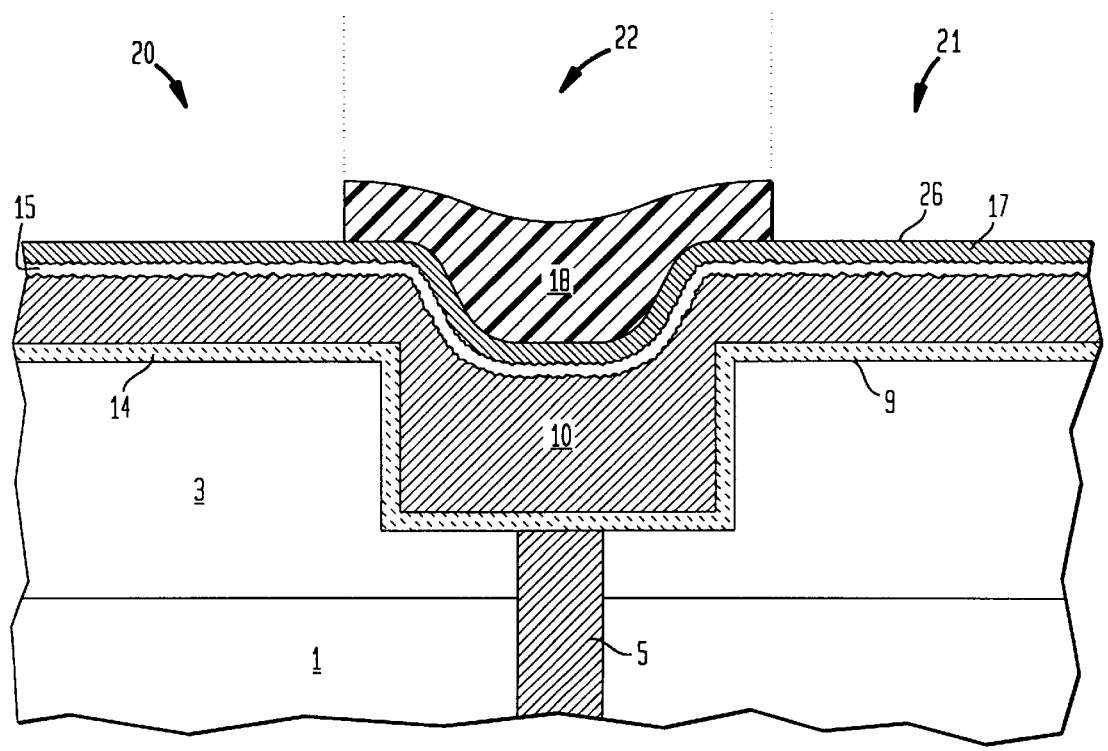

In the exemplary first embodiment as shown in FIG. 4, a photoresist film may be used to form the pattern. In the exemplary first embodiment, a photoresist film 18 is applied to upper surface 26, then patterned. Any process suitable in the art for forming a pattern of the photoresist film 18 may be used. Once patterned, the photoresist film 18 creates exposed field regions 20 and 21 where the composite film will be subsequently removed, and protected region 22 which will remain intact and form the wire-bond pad structure.

Figure 5:
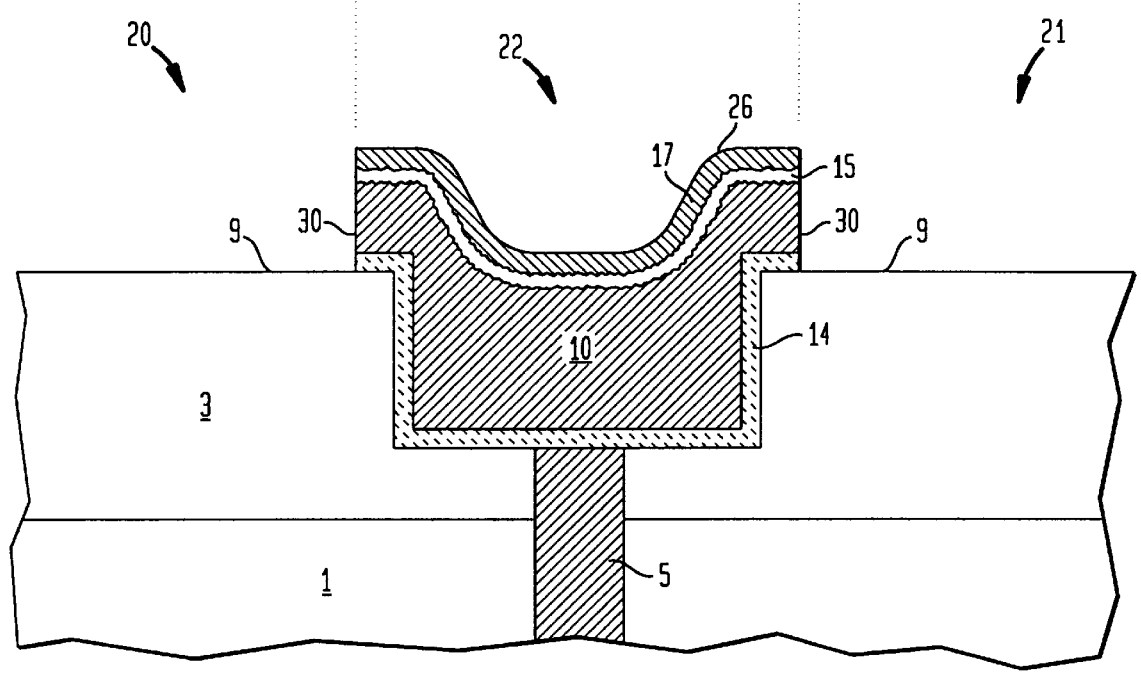

FIG. 5 shows the structure of the present invention after the portions of the composite film exposed in the field regions 20 and 21 have been removed. The composite film (including second copper film 17, impurity film 15, bulk copper film 10, and barrier layer 14) may be removed using any etching process suitable in the art. In the preferred first embodiment, reactive ion etching may be used. The composite film is removed down to exposed surface 9 in field regions 20 and 21. As shown, side walls 30 are exposed.

In protected region 22, the bond pad structure is formed. After the composite film is removed, the photoresist film 18 is removed to expose upper surface 26. Any suitable process, which removes a photoresist film and does not attack the underlying metal structure, may be used.

Figure 6:
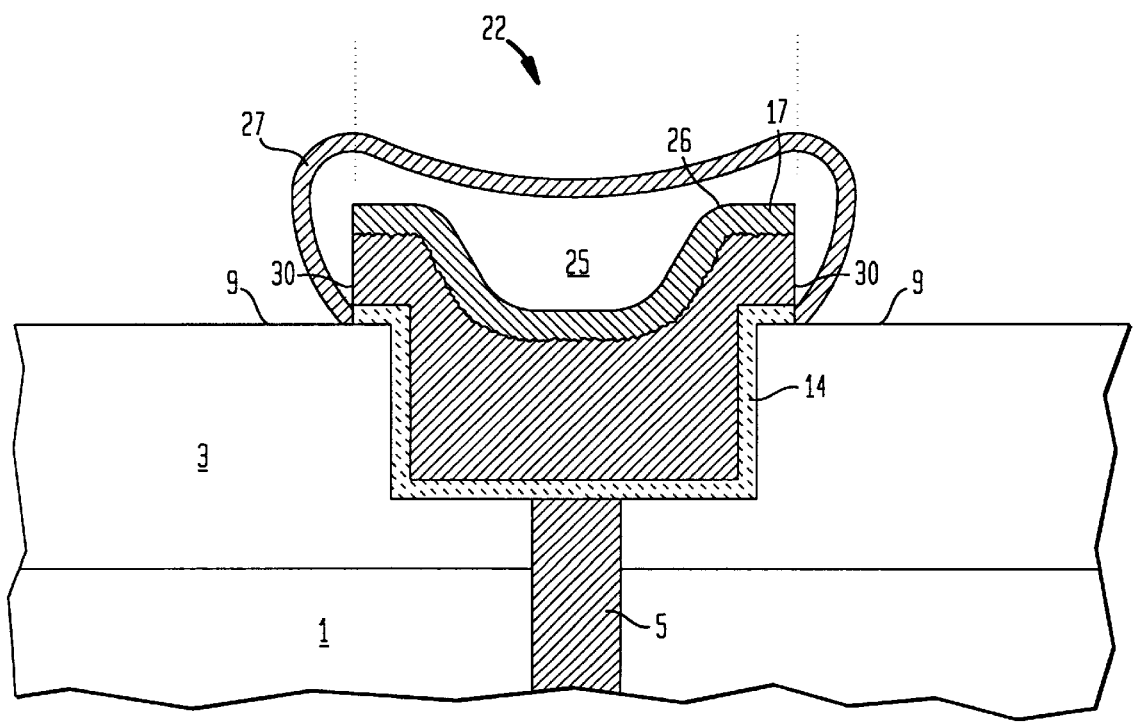

Now turning to FIG. 6, the completed structure which is ready for wire bonding is shown. A NiP or other transition film 25 is selectively formed over exposed upper surface 26 and covers side walls 30. Thus, transition film 25 covers all exposed copper surfaces to preclude copper corrosion resulting from exposure to the environment. The transition film 25 may be formed using any suitable electroless deposition process which provides for selective electroless deposition. Although an NiP film is used in the preferred embodiment, another film such as NiB (nickel boron) or COWP (cobalt-tungsten-phosphorus) may be substituted.

The metal transition film 25 is deposited directly over the laminated pad which includes buried impurities. The laminated impurities such as oxygen, carbon, nitrogen, or sulfur may be close to the pad upper surface 26, and thus to the transition metal film 25. In the preferred first embodiment, NiP film 25 is then coated with a gold film 27, using an immersion gold or electroless gold deposition process. A combination of both immersion plating and electroless plating may also be used. The addition of the gold film 27 is to enhance the integrity of the wire bonding to the NiP film 25 interface.

The wire-bonding pad structure, including the immersion or electroless gold film 27, is then annealed. The anneal stabilizes the microstructure of the deposited gold and urges the interaction between the laminated impurities and the transition film 25 before wire bonding. This final anneal may take place in an inert environment, such as air or nitrogen, at a temperature ranging from 80° C. to 450° C., but most preferably within the temperature range of 100° C. to 400° C. The final anneal time can range from 15 minutes to 3 hours, but most preferably is within the time range of 30 minutes to 2 hours. As the final anneal temperature is increased, the annealing time will be reduced accordingly. In the preferred first embodiment, the anneal conditions are a temperature of 200° C. to 400° C. for about 30 minutes.

During this final anneal heat treatment process, the buried impurities laminated below the copper upper surface 26 interact with NiP film 25 in the preferred embodiment. Buried impurities such as oxygen, which originate in laminated impurity film 15 (as in FIG. 5), travel to the interface formed between the second copper film 17 and the NiP film 25 at upper surface 26. Here, the laminated impurities interact with NiP to form complexes such as NiP(O). The NiP (O) complex impedes the undesired reaction of NiP and copper at high temperatures, thereby enhancing the reliability of the NiP-copper interface. In alternate embodiments, impurities which form may include NiB(O) or CoWP(O), or complexes with carbon, sulfur, oxygen, and nitrogen. The structure shown in FIG. 6 is now ready for wire bonding.

EXAMPLE 2

Figure 7:
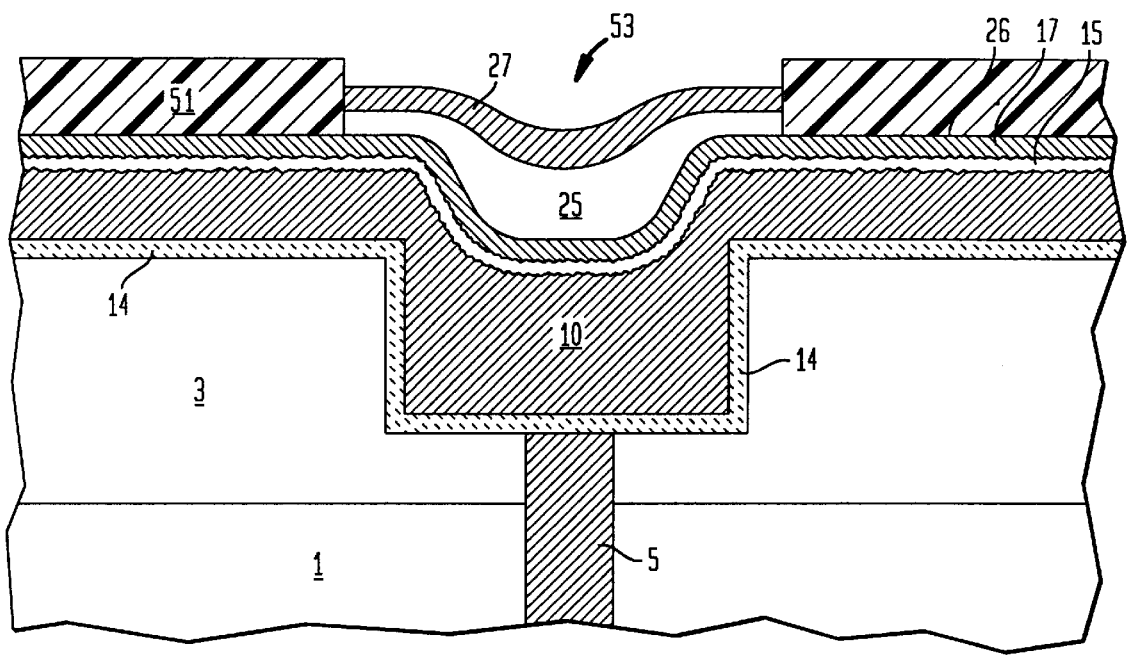
FIGS. 7 and 8 are cross-sectional views showing the process sequence used to form a second exemplary embodiment of the present invention. More specifically.

FIG. 7 shows an alternate process for producing a completed metal bond pad structure from the composite film as shown in FIG. 3. After the structure is annealed according to the initial annealing process described in conjunction with FIG. 3 of Example 1, a "plate-through" pattern is formed on upper surface 26 of the composite film instead of the photoresist pattern as shown in FIG. 4.

In the preferred second embodiment, a photoresist film 51 is used to form the plate-through pattern. In an alternate embodiment, a low-temperature polyimide material may be used. After a pattern has been formed, exposing region 53 which will form a bond pad, an NiP or other transition film 25 is selectively deposited onto region 53. After the NiP film 25 is formed in the preferred embodiment, a gold film 27 is selectively formed over the NiP film 25. The gold film 27 may be formed using immersion or electroless plating.

Figure 8:
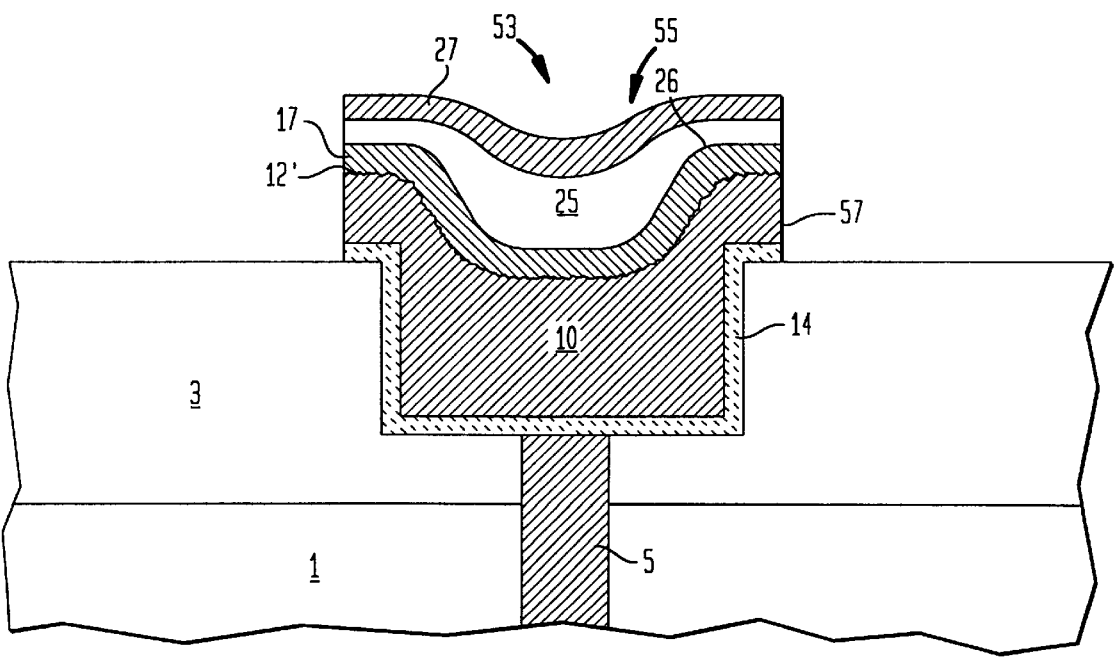

Now turning to FIG. 8, the patterned photoresist film 51 is removed. Any process available in the art, which removes the photoresist or low-temperature polyimide film and does not significantly attack the metal structure, may be used. Portions of bulk copper 10, impurity film 15, and second copper film 17 which lie outside of region 53, and which will not form part of the wire-bond pad 55, are next removed using gold film 27 as a photomask. In the preferred second embodiment, a 1 to 5 percent by volume acidified ammonium persulfate solution may be used to selectively remove the copper. This etch procedure exposes side walls 57 of the bulk copper film 10. After the composite copper film is removed, the unmasked sections of the barrier film 14 may be removed with a reactive ion etch process using $CF_4$.

In this manner, final bond pad structure 55 is formed. The final bonding pad structure 55 is then annealed using the final annealing process as described in conjunction with FIG. 6 in Example 1. This annealing process stabilizes the structure and causes the interaction, between the laminated impurities from laminated impurity film 15 shown in FIG. 7 and the NiP film 25 at upper surface 26, which forms the NiP-copper interface.

Final bond pad structure 55 is formed within trench 7 of a damascene structure. Final bond pad structure 55 includes barrier film 14, first bulk copper film 10 having roughened surface 12', second bulk copper film 17, and NiP film 25 (in the preferred second embodiment) and is covered by gold film 27. At the upper surface 26 which forms the interface between the second bulk copper film 17 and the NiP film 25, the impurities from laminated impurity film 15, shown in FIG. 7, form complexes with the NiP film 25.

As formed, the final bond pad structure 55 includes exposed copper side walls 57. In the preferred second embodiment, after the structure is wire bonded to a gold wire, an epoxy is used to cover the entire bond area and to encapsulate the exposed copper side walls 57. Such encapsulation prevents exposure of the copper to the environment and, possibly, corrosion. In an alternate embodiment, an NiP cover may be deposited onto side walls 57 before removal of the barrier layer 14 using any suitable electroless deposition process which provides for selective deposition.

EXAMPLE 3

Figure 9:
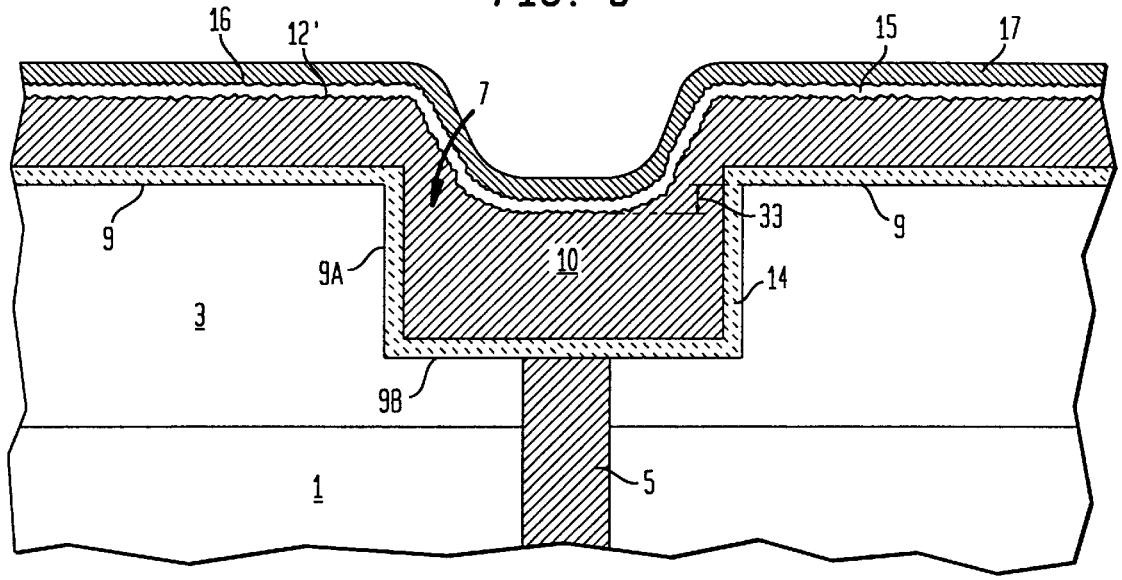
FIGS. 9 through 13 are cross-sectional views showing the process sequence used to form a third exemplary embodiment of the present invention using damascene techniques. More specifically.

FIG. 9 shows the first step in the formation of the third exemplary embodiment of the present invention. The structure that appears in FIG. 9 is formed in the same manner as the structure described in conjunction with FIG. 3, including the initial annealing operation. In this third exemplary embodiment, chemical mechanical polishing (CMP) is used to form the structure of the present invention.

FIG. 9 shows the damascene trench 7 formed within the insulating film 3 of substrate 1. The structure includes via 5, and barrier layer 14 formed over the exposed surfaces: upper surface 9, side wall surfaces 9A, and bottom surface 9B. Electrodeposited bulk copper film 10 covers the barrier layer 14 and fills the greater part of the cross-sectional area of the trench 7. The copper film 10 has a top roughened surface 12' which has been roughened by the spin-etch process as described above. Roughened surface 12' is recessed by a distance 33 below upper exposed surface 9 in the center area of trench 7. Laminated impurity film 15 covers roughened surface 12'. The second electrodeposited bulk copper film 17 covers the structure and fills the trench 7, as previously described.

In the preferred third embodiment, the thickness of the bulk copper film 10 is chosen so that approximately 85% of the cross-sectional area of the trench 7 is filled with the first bulk copper film 10. The trench 7 must not be completely filled by copper film 10, to insure that the laminated impurity film 15 and the second deposited bulk copper film 17 have components that remain within the trench 7 after a subsequent polishing step planarizes the structure as will be seen in FIG. 10. In contrast, in Example 1 the structure is not subsequently planarized and the location of the laminated impurity film 15 with respect to upper exposed surface 9 is not quite as critical.

Figure 10:
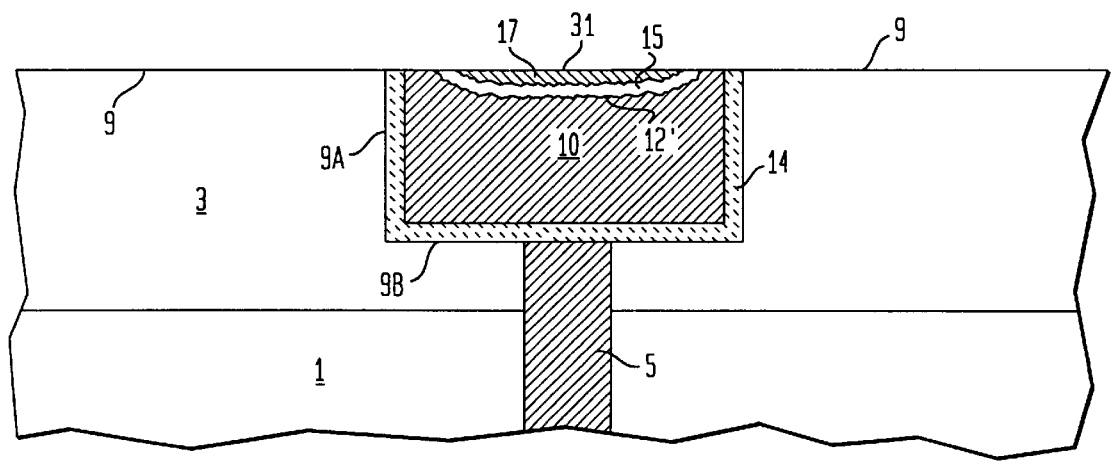

After the structure is annealed according to the initial annealing process described in conjunction with FIG. 3 of Example 1, the overburden of the copper film structure is removed as shown in FIG. 10. The structure in FIG. 10 is produced after chemical mechanical polishing steps have been used to planarize the structure. The device so planarized includes a copper film structure having an upper surface 31 which is substantially continuous and co-planar with upper exposed surface 9 of the dielectric insulating film 3 formed on the substrate 1. The metal film structure includes portions of the first electrodeposited bulk copper film 10 and the second electrodeposited bulk copper film 17. In between these two films, laminated impurity film 15 is interposed.

Figure 11:
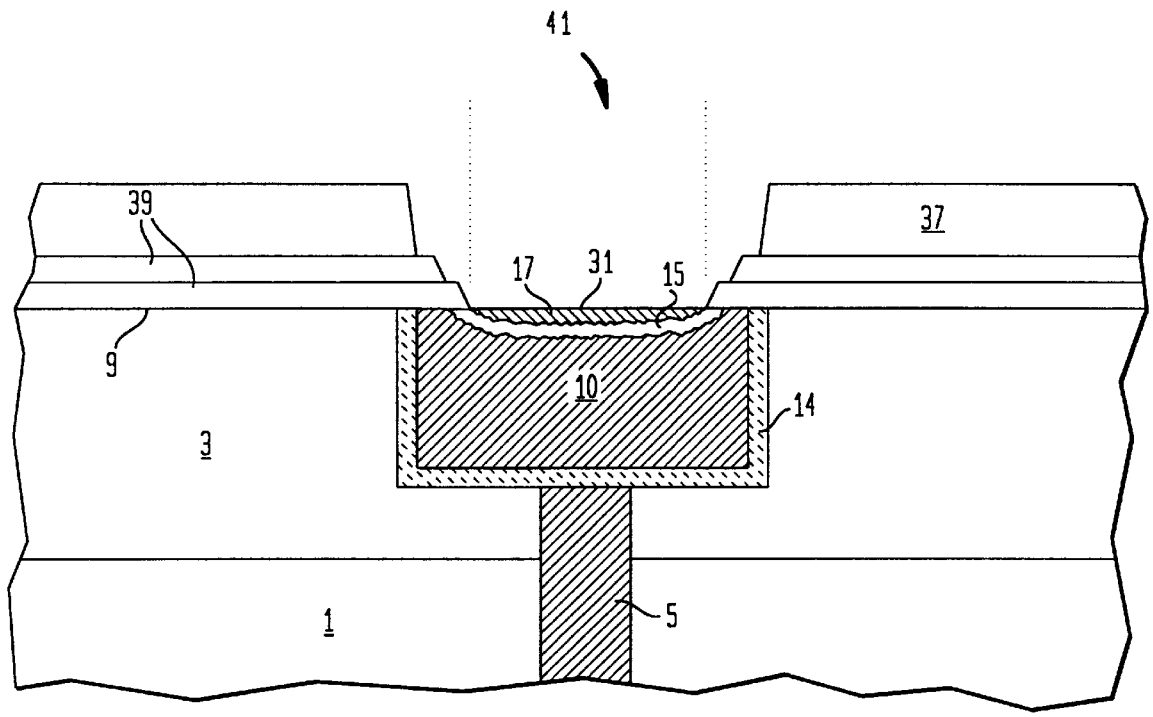

Now turning to FIG. 11, an insulating film is formed and patterned over surfaces 9 and 31 of the planarized structure. The insulating film may consist of dual interlevel dielectric films 39, formed directly over the surfaces, and a polyimide film 37 disposed over the dual interlevel dielectric films 39. The polyimide film 37 and dual interlevel dielectric films 39 are patterned and etched using reactive ion etching chemistry to form a pattern which exposes a region 41 of the exposed upper surface 31 of the composite metal film structure. This region 41 is the region to which a wire-bonding connection will ultimately be made.

Figure 12:
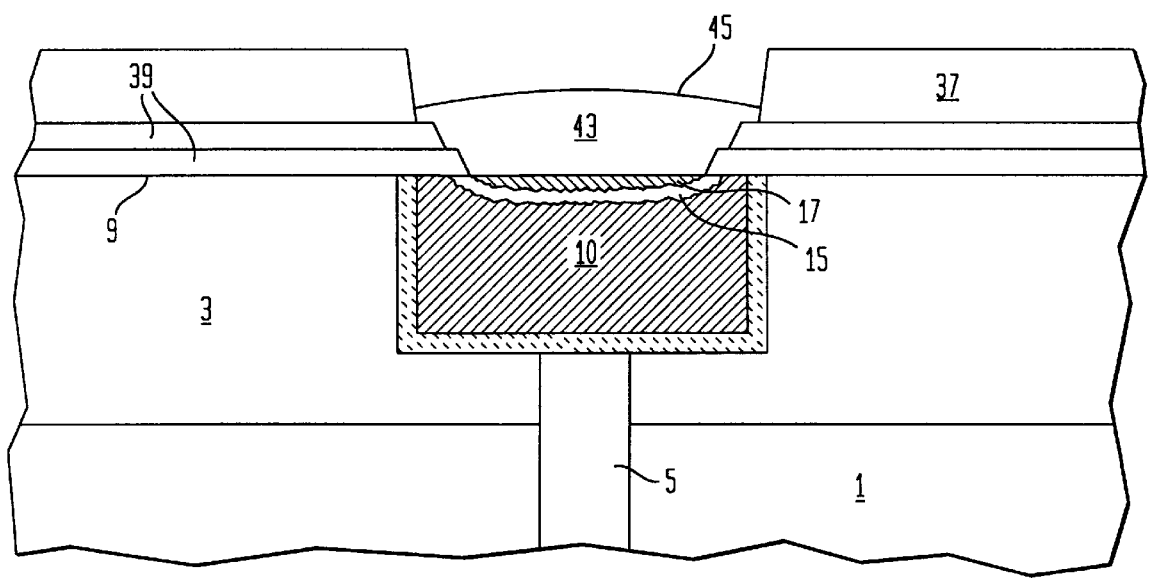

Now turning to FIG. 12, in the preferred third embodiment, an NiP film 43 is formed by electroless or other suitable selective deposition techniques to cover the exposed region 41 of upper surface 31. Although an NiP film 43 is used in the preferred third embodiment, other transition films such as NiB or COWP may be used in alternate embodiments. The NiP film 43 has a top surface 45. Laminated impurity film 15 and second electrodeposited bulk copper film 17 are included in the structure.

Figure 13:
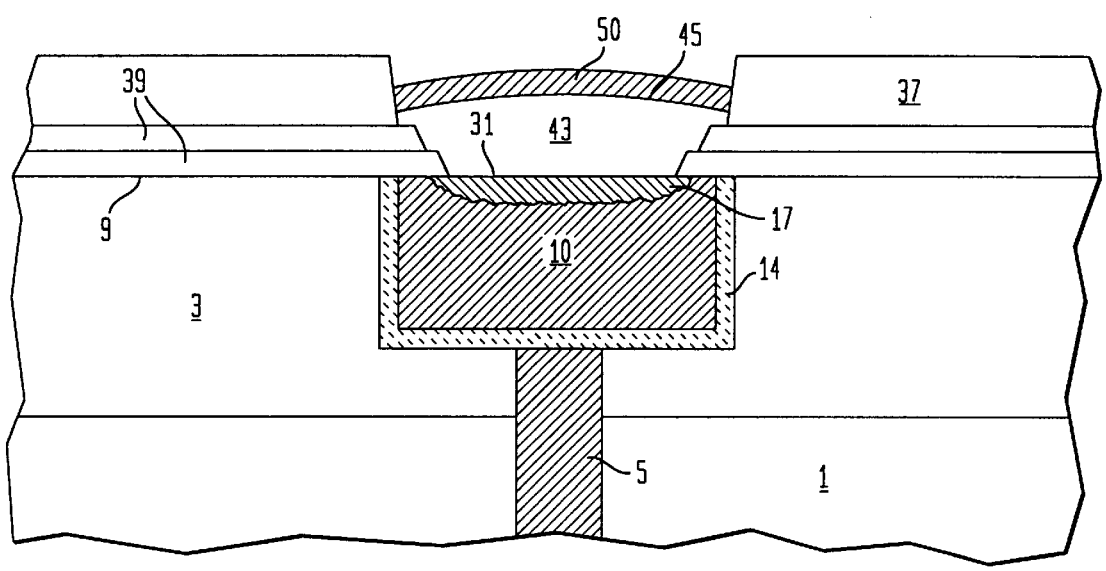

Now turning to FIG. 13, a gold film 50 is selectively deposited over NiP top surface 45. The gold film 50 is preferably formed by immersion plating or electroless plating processes, or the combination of both. This gold layer 50 is then stabilized by using the final annealing process as described in conjunction with FIG. 6 of Example 1.

This final annealing process urges the combination of elements from the impurity laminated film 15 (of FIG. 12) with the NiP (or other) film 43 to form chemical mixtures or complexes which prevent the interaction of the NiP (or other) film 43 with copper. The complexes and mixtures formed may include NiP(O), NiB(O), and COWP(O) and are formed at the upper surface 31 which represents the interface between the NiP film 25 and the bulk copper films 17 and 10.

As described above, Examples 1, 2, and 3 represent exemplary embodiments of the present invention and are not intended to limit the scope of the present invention. The details of the specific processes used to form various components of the structure may be varied and still lie within the scope of the present invention. In addition, the thickness of the various films may be varied. Specifically, the thickness of the first and second deposited bulk copper films 10 and 17 formed within the trench 7 may be varied depending on the subsequent processing sequence anticipated.

The semiconductor structures detailed above are intended to be exemplary only. Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An improved copper-containing pad for gold wire bonding having an upper copper surface and a nickel-containing film disposed over said upper copper surface including nickel and a component, wherein the improvement comprises:

an impurity disposed beneath said upper copper surface;

an interface formed between said nickel-containing film and said upper copper surface; and a chemical mixture disposed at said interface and formed from an interaction between said nickel-containing film and an impurity film originally laminated within said pad.

2. The improved copper-containing pad as in claim 1, wherein said chemical mixture includes nickel, said component, and said impurity.

3. The improved copper-containing pad as in claim 1, wherein said nickel-containing film includes phosphorus.

4. The improved copper-containing pad as in claim 1, wherein said nickel-containing film includes boron.

5. The improved copper-containing pad as in claim 1, wherein said impurity film includes oxygen.

6. The improved copper-containing pad as in claim 1, wherein said impurity film includes at least one of nitrogen, sulfur, and carbon.

7. The improved copper-containing pad as in claim 1, wherein said chemical mixture comprises NiP(O).

8. The improved copper-containing pad as in claim 1, further comprising a gold film covering said nickel-containing film.

* * * * *